United States Patent
Huang

(10) Patent No.: US 10,684,325 B2
(45) Date of Patent: Jun. 16, 2020

(54) JITTER MONITORING CIRCUIT

(71) Applicant: Taiwan Semiconductor Manufacturing Co., Ltd., Hsinchu (TW)

(72) Inventor: Tien-Chien Huang, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 16/203,338

(22) Filed: Nov. 28, 2018

(65) Prior Publication Data

US 2019/0162783 A1 May 30, 2019

Related U.S. Application Data

(60) Provisional application No. 62/592,650, filed on Nov. 30, 2017.

(51) Int. Cl.
G01R 31/317 (2006.01)

(52) U.S. Cl.
CPC . *G01R 31/31709* (2013.01); *G01R 31/31725* (2013.01)

(58) Field of Classification Search
CPC .................. G01R 31/31709; G01R 31/31725
See application file for complete search history.

(56) References Cited

U.S. PATENT DOCUMENTS

| | | | | |
|---|---|---|---|---|
| 7,414,483 B2* | 8/2008 | Shimamoto | ........ | G01R 31/3016 327/261 |
| 7,439,724 B2* | 10/2008 | Heidel | ............... | G01R 31/3016 324/76.55 |
| 7,885,322 B2* | 2/2011 | Nakano | ............ | G01R 31/31709 375/226 |
| 2003/0076181 A1* | 4/2003 | Tabatabaei | .............. | G04F 10/06 331/57 |
| 2003/0098731 A1* | 5/2003 | Tabatabaei | .............. | G04F 10/00 327/160 |
| 2018/0372783 A1* | 12/2018 | Huang | ...................... | H03L 7/08 |

OTHER PUBLICATIONS

Gantsog, E. et al., "0.89 mW On-Chip Jitter-Measurement Circuit or High Speed Clock with Sub-Picosecond Resolution", ESSCIRC Conference 2016: 42nd European Solid-State Circuits Conference, Sep. 2016, pp. 457-460.
Ishida, M. et al., On-Chip Circuit for Measuring Data Jitter in the Time or Frequency Domain, 2007 IEEE Radio Frequency Integrated Circuits Symposium, pp. 347-350.
(Continued)

*Primary Examiner* — Patrick O Neill
(74) *Attorney, Agent, or Firm* — Duane Morris LLP

(57) ABSTRACT

A circuit includes: a first delay circuit configured to receive a first clock signal; a second delay circuit configured to receive a second clock signal; a delay control circuit, coupled to the first and second delay circuits, and configured to cause the first and second delay circuits to respectively align the first and second clock signals within a noise window; and a loop control circuit, coupled to the first and second delay circuits, and configured to alternately form a first oscillation loop and a second oscillation loop passing through each of the first and second delay circuits so as to determine the noise window.

20 Claims, 7 Drawing Sheets

(56) References Cited

OTHER PUBLICATIONS

Hsu, J.C. et al., BIST for Measuring Clock Jitter of Charge-Pump Phase-Locked Loops, IEEE Transactions on Instrumentation and Measurement, Feb. 2008, 57(2):276-285.

Niitsu, K. et al., "CMOS Circuits to Measure Timing Jitter Using a Self-Referenced Clock and a Cascaded Time Difference Amplifier With Duty-Cycle Compensation", IEEE Journal of Solid-State Circuits, Nov. 2012, 47(11):2701-2710.

* cited by examiner

US 10,684,325 B2

JITTER MONITORING CIRCUIT

CROSS-REFERENCE TO RELATED APPLICATION

The present application claims priority to U.S. Provisional Patent Application No. 62/592,272, filed on Nov. 29, 2017, which is incorporated by reference herein in its entirety.

BACKGROUND

In electronic and/or telecommunication applications, jitter is a time deviation from a true periodicity of a presumably periodic signal. Among various causes of the jitter are electromagnetic interference (EMI) and crosstalk with other periodic or non-periodic signals. Such jitter is typically considered as a noise effect in a circuit, device or system. The jitter generally cause various issues for a respective circuit, device or system such as, for example, causing a display monitor to flicker, disadvantageously affecting an ability of a processor of a desktop or server to perform as originally intended operation, inducing clicks or other undesired effects in audio signals, loss of transmitted data between network devices, etc. Thus, there exists a need for a technique to accurately and quickly detect the presence of jitter in a circuit, device or system, and further determine the amount of such jitter (e.g., the range of the jitter).

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

The present disclosure provides various embodiments of a jitter monitoring circuit that can detect a presence of jitter in a clock signal based on a noise window, and can further accurately determine the magnitude of the noise window. In some embodiments, the jitter monitoring circuit determines the presence of jitter by detecting whether a timing difference of respective transitioning edges of the clock signal and a reference clock signal exceeds the noise window. In response to detecting the presence of jitter, the clock signal and reference clock signal are respectively adjusted (e.g., delayed) by first and second delay circuits to cause the timing difference of the respective transitioning edges to be less than the noise window. Further, the jitter monitoring circuit includes a loop control circuit configured to alternately form a first oscillation loop and a second oscillation loop passing through each of the first and second delay circuits. In some embodiments, based on a first oscillation frequency of the alternately formed first and second oscillation loops passing through the first delay circuit and a second oscillation frequency of the alternately formed first and second oscillation loops passing through the second delay circuit, the jitter monitoring circuit can accurately determine the noise window.

Figure 1:
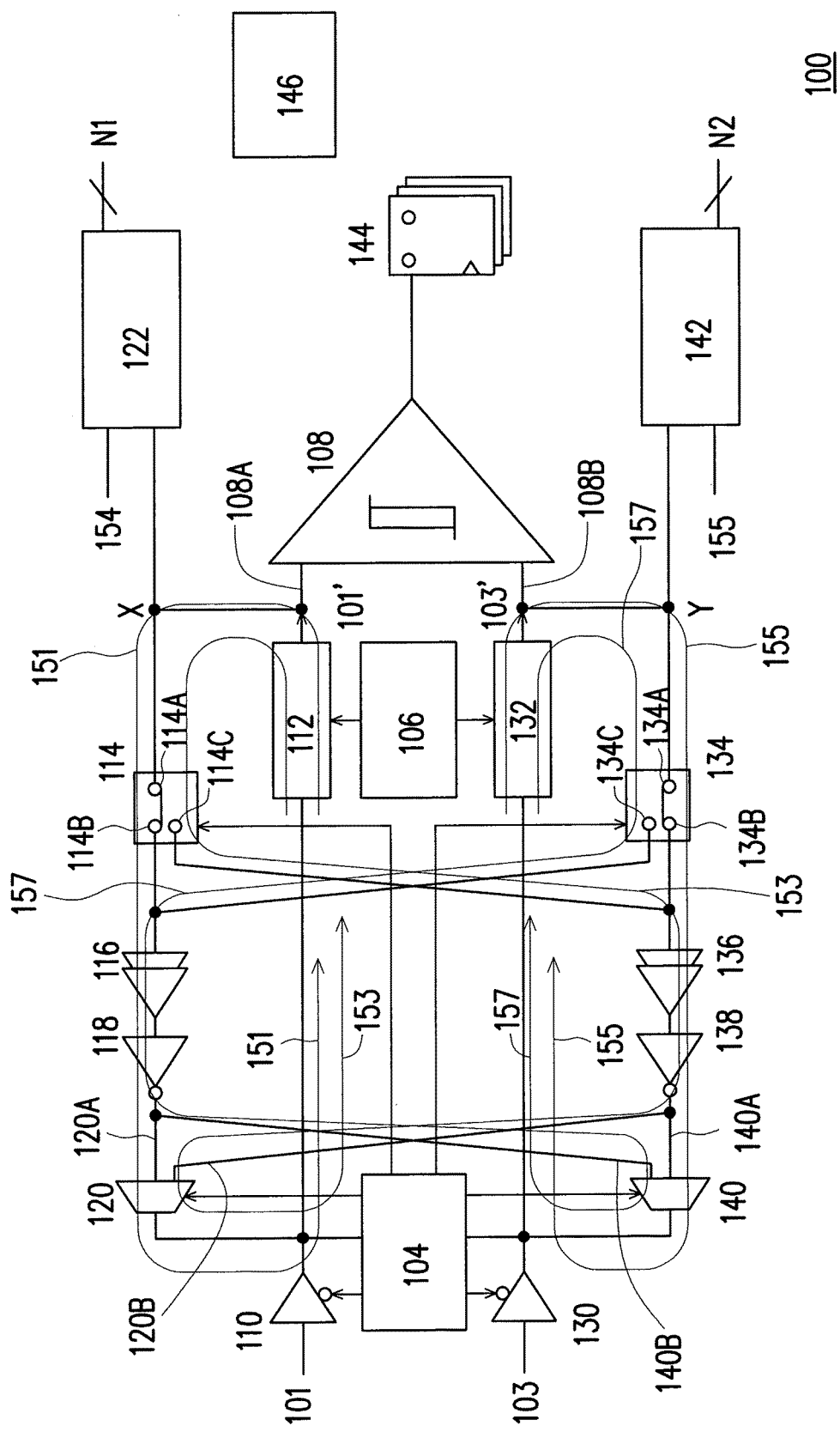
FIG. 1 illustrates an exemplary schematic diagram of a jitter monitoring circuit, in accordance with some embodiments.

FIG. 1 illustrates a schematic diagram of a jitter monitoring circuit 100, in accordance with some embodiments. In some embodiments, the jitter monitoring circuit 100 is configured to detect a presence of jitter in a clock signal (e.g., 101) by determining whether the timing difference between respective transition edges of the clock signal and a reference clock signal (e.g., 103) exceeds a noise window, and further determine the magnitude of the noise window. Details of the jitter monitoring circuit 100 will be discussed as follows.

The clock signal 101 may be generated by a clock generation circuit, for example, a phase-locked-loop (PLL) circuit integrated in a bigger system circuit (e.g., a system-on-chip (SoC) circuit, an application-specific integrated circuit (ASIC), etc.). The reference clock signal 103 may be provided by an external crystal circuit, which is generally considered as a relatively reliable clock generation source, thus making the reference clock signal 103 a reliable reference. In some other embodiments, the reference clock 103 can be provided by either delaying the clock signal 101 by a pre-defined period of time or from another low-noise PLL, even off-chip instruments. The clock generation circuit, which provides the clock signal 101, may be configured to provide one or more synchronous or asynchronous functionalities to the bigger system circuit. Thus, by coupling the disclosed jitter monitoring circuit 100 to such a bigger system circuit, the clock signal 101 may be accurately monitored in a real-time manner.

As shown in the illustrated embodiment of FIG. 1, the jitter monitoring circuit 100 includes a loop control circuit 104, a delay control circuit 106, a jitter detector 108, a first controllable buffer 110, a first delay circuit 112, a first switch 114, one or more buffers 116 (which are herein referred to as "first buffer 116"), a first inverter 118, a first multiplexer 120, a first frequency counter 122, a second controllable buffer 130, a second delay circuit 132, a second switch 134, one or more buffers 136 (which are herein referred to as "second buffer 136"), a second inverter 138, a second multiplexer 140, a second frequency counter 142, one or more registers 144 (which are herein referred to as "register 144"), and a main control circuit 146. Although not shown, in some embodiments, the main control circuit 146 is coupled to each of the other components of the jitter monitoring circuit 100 (e.g., 104, 106, 144, etc.) to control them, which will be discussed in further detail below.

Referring still to FIG. 1, the jitter detector 108 is configured to respectively receive the clock signal 101 through the first controllable buffer 110 and first delay circuit 112 and the reference clock signal 103 through the second controllable buffer 130 and second delay circuit 132. As such, the jitter detector 108 may receive a delayed clock signal 101', which is delayed by the first delay circuit 112, at its input 108A, and a delayed reference clock signal 103', which is delayed by the second delay circuit 132, at its input 108B. Further, the jitter detector 108 is configured to compare respective transition edges between the delayed clock signal 101' and the delayed reference clock signal 103' so as to determine whether the clock signal 101 contains jitter that exceeds a noise window. If so, the jitter detector 108 may output a high logic state (hereinafter "logic 1") to the register 144. On the other hand, if no jitter is detected or the jitter in the clock signal 101 does not exceed the noise window, the jitter detector 108 may output a low logic state (hereinafter "logic 0") to the register 144. Thus, it is understood that over a certain period of time (after the jitter detector 108 compares a plurality of transition edges between the delayed clock signal 101' and the delayed reference clock signal 103'), the jitter detector 108 may output a plurality of logic 1's, logic 0', or combination thereof. In some embodiments, when the jitter detector 108 compares the delayed clock signal 101' with the delayed reference clock signal 103' to detect the above-mentioned jitter in the clock signal 101, the jitter monitoring circuit 100 may be referred to as operating at a "Normal Monitoring Mode." Details of the jitter detector 108 will be discussed in feather detail below with reference to FIGS. 2A, 2B, 3A, 3B, and 4.

In some embodiments, the main control circuit 146 is configured to read such logic states stored in the register 144, and in response to reading one or more logic 1's, the main control circuit 146 may cause the delay control circuit 106 to control the first and second delay circuits 112 and 132 to respectively tune the timings of the clock signal 101 and reference clock signal 103 (i.e., delay) until the jitter detector 108 again outputs the logic 0 (i.e., the jitter contained in the clock signal does not exceed the noise window). In some embodiments, the first and second delay circuits 112 and 132 may be each implemented by a digitally controlled delay line (DCDL). In such embodiments, the delay control circuit 106 may "digitally" adjust how much delay the delay circuits 112 and 132 will apply on the clock signal 101 and reference clock signal 103, respectively. For example, the delay control circuit 106 may select the delay code out of 0 to 63 for the second delay circuit 132 (hereinafter "second delay code") as 31. Generally, each delay code corresponds to a certain time amount of delay, and the larger the delay code is, the longer the delay is. On the other hand, the delay control circuit 106 may sweep the delay code from 0 to 63 for the first delay circuit 112 (hereinafter "first delay code") to allow the output of jitter detector 108 to transition back to the logic 0.

Continuing with the above example, the main control circuit 146 may acknowledge that when the first delay codes range from 30 to 33 (while the second delay code is fixed as 31), the jitter detector 108 can accordingly output plural logic 0's. As such, the jitter monitoring circuit 100, or more specifically the main control circuit 146, may determine that the noise window, actually used by the jitter detector 108 to selectively output either a logic 1 or 0, corresponds to a delay code window that is defined by the first delay code set at 29 (one delay code less than 30) and the second delay code set at 31, or the first delay code set at 34 (one delay code greater than 33) and the second delay code set at 31. Accordingly, the main control circuit 146 may cause the delay control circuit 106 to fix the first delay code at 29 and the second delay code at 31, for example, and cause the loop control circuit 104 to alternately form first and second oscillation loops passing through each of the first and second delay circuits 112 and 132. In some embodiments, by forming such first and second oscillation loops for each of the first and second delay circuits 112 and 132, the magnitude of the noise window actually used by the jitter detector 108 can be accurately determined, which will be discussed in further detail below. In some embodiments, when the loop control circuit 104 alternately forms the oscillation loops for each of the first and second delay circuits 112 and 132, the jitter monitoring circuit 100 may be referred to as operating at a "Noise Window Calculation Mode."

In some embodiments, when operating at the Noise Window Calculation Mode, the delay control circuit 106 may cause the first and second delay circuits 112 and 132 to respectively use the above-discussed first and second delay codes for the clock signal 101 and reference clock signal 103, the loop control circuit 104 may deactivate the controllable buffers 110 and 130 to respectively decouple the clock signal 101 from the first delay circuit 112 and the reference clock signal 103 from the second delay circuit 132 thereby allowing plural oscillation loops passing through each of the first and second delay circuits 112 and 132, and the main control circuit 146 may activate the first and second frequency counters 122 and 142 to count respective cycle numbers of oscillations passing through the first and second delay circuits 112 and 132.

More specifically, after the first controllable buffer 110 is deactivated and the first delay circuit 112 uses the first delay code, a first oscillation loop 151, passing through the first delay circuit 112, the first switch 114, the first buffer 116, the first inverter 118, and the first multiplexer 120, can be formed by the first switch 114 to couple its terminal 114A to terminal 114B and by the first multiplexer 120 to select its input 120A; and a second oscillation loop 153, passing through the first delay circuit 112, the first switch 114, the second buffer 136, the second inverter 138, and the first multiplexer 120, can be formed by the first switch 114 to couple its terminal 114A to terminal 114C and by the first multiplexer 120 to select its input 120B. In some embodiments, the loop control circuit 104 causes the first switch 114 to couple its terminal 114A to either terminal 114B or 114C, and causes the first multiplexer 120 to make the selection between inputs 120A and 120B. In other words, the first oscillation loop 151 and second oscillation loop 153, passing through the first delay circuit 112, are formed by the loop control circuit 104. Further, in some embodiments, the loop control circuit 104 may alternately form the first oscillation loop 151 and second oscillation loop 153 to allow the first frequency counter 122 to count a total cycle number, $N_1$, presented by the first and second oscillation loops 151 and 153.

In some embodiments, the first frequency counter 122 counts the total cycle number $N_1$ of the first and second oscillation loops 151 and 153 by comparing the frequency presented at node "X" (hereinafter "frequency X") with a reference frequency 154, or a lowered reference frequency 154 (which will be discussed below), that is substantially less than the frequency X. As such, it is understood by persons of ordinary skill in the art that the corresponding period of the reference frequency 154 is substantially greater than the corresponding period of the frequency X. In some embodiments, the first frequency counter 122 may determine the total cycle number $N_1$ of the first and second oscillation loops 151 and 153 by counting how many corresponding periods of the frequency X are contained in one corresponding period of the reference frequency 154.

Similarly, after the second controllable buffer 130 is deactivated and the second delay circuit 132 uses the second delay code, a first oscillation loop 155, passing through the second delay circuit 132, the second switch 134, the second buffer 136, the second inverter 138, and the second multiplexer 140, can be formed by the second switch 134 to couple its terminal 134A to terminal 134B and by the second multiplexer 140 to select its input 140A; and a second oscillation loop 157, passing through the second delay circuit 132, the second switch 134, the first buffer 116, the first inverter 118, and the second multiplexer 140, can be formed by the second switch 134 to couple its terminal 134A to terminal 134C and by the second multiplexer 140 to select its input 140B. In some embodiments, the loop control circuit 104 causes the second switch 134 to couple its terminal 134A to either terminal 134B or 134C, and causes the second multiplexer 140 to make the selection between inputs 140A and 140B. In other words, the first oscillation loop 155 and second oscillation loop 157, passing through the second delay circuit 132, are formed by the loop control circuit 104. Further, in some embodiments, the loop control circuit 104 may alternately form the first oscillation loop 155 and second oscillation loop 157 to allow the second frequency counter 142 to count a total cycle number, $N_2$, presented by the first and second oscillation loops 155 and 157.

In some embodiments, the second frequency counter 122 counts the total cycle number $N_2$ of the first and second oscillation loops 155 and 157 by comparing the frequency presented at node "Y" (hereinafter "frequency Y") with the reference frequency 155, or the lowered reference frequency 155 (which will be discussed below), that is substantially less than the frequency Y. As such, it is understood by persons of ordinary skill in the art that the corresponding period of the reference frequency 155 is substantially greater than the corresponding period of the frequency Y. In some embodiments, the second frequency counter 142 may determine the total cycle number $N_2$ of the first and second oscillation loops 155 and 157 by counting how many corresponding periods of the frequency Y are contained in one corresponding period of the reference frequency 155.

By retrieving the cycle number $N_1$ of the alternately formed oscillation loops passing through the first delay circuit 112 and the cycle number $N_2$ of the alternately formed oscillation loops passing through the second delay circuit 132, the noise window, actually used by the jitter detector 108, can be accurately calculated, in accordance with some embodiments. This is because the actually used noise window is determined by a difference between the delay provided by the first delay circuit 112 and the delay provided by the second delay circuit 132, and in some embodiments, such a difference between the delay provided by the first delay circuit 112 and the delay provided by the second delay circuit 132 can be accurately determined by the reference frequency 155 and a difference between the cycle numbers $N_1$ and $N_2$, for example, $$\frac{N}{\text{Reference Frequency 155}}\left(\frac{1}{N_1} - \frac{1}{N_2}\right)$$

where N is a predefined constant, which will be discussed as follows.

In some embodiments, the reference frequency 155 may be provided by an external crystal circuit, which is generally considered as a relatively reliable clock generation source, and further divided by a predefined constant. In some embodiments, the reference frequency 155 may be provided to be substantially less than the frequency X and frequency Y, and, moreover, the predefined constant N is selected to be a positive integer (e.g., 32) to further lower the reference frequency 155 as $$\frac{\text{Reference Frequency 155}}{N}$$

(hereinafter "lowered reference frequency 155"). Accordingly, the corresponding period of such a lowered reference frequency is $$\frac{N}{\text{Reference Frequency 155}}.$$

In some embodiments, the cycle number $N_1$ is determined by dividing the corresponding period of the lowered reference frequency 155 by the corresponding period of frequency X (i.e., $$N_1 = \frac{\left(\frac{N}{\text{Reference Frequency 155}}\right)}{\text{Corresponding Period of Frequency } X},$$

and the cycle number $N_2$ is determined by dividing the corresponding period of the lowered reference frequency 155 by the corresponding period of frequency Y (i.e., $$N_2 = \frac{\left(\frac{N}{\text{Reference Frequency 155}}\right)}{\text{Corresponding Period of Frequency } Y}.$$

Since the cycle numbers $N_1$ and $N_2$ are provided by the frequency counters 122 and 142, respectively, the corresponding periods of frequency X and frequency Y can be accordingly determined based on the above equations of $N_1$ and $N_2$, in accordance with some embodiments. Further, since the actually used noise window used by the jitter detector 108 is determined by the difference between the delay provided by the first delay circuit 112 and the delay provided by the second delay circuit 132, calculating a difference between the corresponding periods of frequency X and frequency Y (i.e., $$\frac{N}{\text{Reference Frequency 155}}\left(\frac{1}{N_1} - \frac{1}{N_2}\right))$$

can accurately determine the noise window used by the jitter detector 108, which will be explained as follows.

In some embodiments, the corresponding period of the frequency X is determined by dividing a first weighted sum by $N_1$, wherein the first weighted sum can be a sum of: the delay provided by the first delay circuit 112 ($D_{112}$) times $N_1$, the delay provided by the first switch 114, the delays collectively provided by the first buffer 116 and first inverter 118 ($D_{116+118}$) times the cycle number of the first oscillation loop 151 (which is $(N_1+1)/2$ when $N_1$ is an odd integer, and is $N_1/2$ when $N_1$ is an even integer), the delays collectively provided by the second buffer 136 and second inverter 138 ($D_{136+138}$) times the cycle number of the second oscillation loop 153 (which is $(N_1-1)/2$ when $N_1$ is an odd integer, and is $N_1/2$ when $N_1$ is an even integer), and the delay provided by the first multiplexer 120, wherein the delays respectively provided by the first switch 114 and first multiplexer 120 are substantially negligible when compared to the others. Thus, in accordance with some embodiments, the corresponding period of the frequency X may be expressed as, $$\frac{1}{N_1}\left[D_{112} \times N_1 + D_{116+118} \times \left(\frac{N_1+1}{2} \text{ or } \frac{N_1}{2}\right) + D_{136+138} \times \left(\frac{N_1-1}{2} \text{ or } \frac{N_1}{2}\right)\right].$$

Similarly, the corresponding period of the frequency Y over the $N_2$ cycle is determined by dividing a second weighted sum by $N_2$, wherein the second weighted sum can be a sum of: the delay provided by the second delay circuit 132 ($D_{132}$) times $N_2$, the delay provided by the second switch 134, the delays collectively provided by the second buffer 136 and second inverter 138 ($D_{136+138}$) times the cycle number of the first oscillation loop 155 (which is $(N_2+1)/2$ when $N_2$ is an odd integer, and is $N_2/2$ when $N_2$ is an even integer), the delays collectively provided by the first buffer 116 and first inverter 118 ($D_{116+118}$) times the cycle number of the second oscillation loop 157 (which is $(N_2-1)/2$ when $N_2$ is an odd integer, and is $N_2/2$ when $N_2$ is an even integer), and the delay provided by the second multiplexer 140, wherein the delays respectively provided by the second switch 134 and second multiplexer 140 are substantially negligible when compared to the others. Thus, the corresponding period of the frequency Y may be expressed as, $$\frac{1}{N_2}\left[D_{132} \times N_2 + D_{136+138} \times \left(\frac{N_2+1}{2} \text{ or } \frac{N_2}{2}\right) + D_{116+118} \times \left(\frac{N_2-1}{2} \text{ or } \frac{N_2}{2}\right)\right],$$

in accordance with some embodiments.

In accordance with some embodiments of the present disclosure, after simplification, the corresponding periods of the frequency X and frequency Y have plural common terms, $\frac{1}{2}D_{116+118}$, and $\frac{1}{2}D_{136+138}$, which respectively account for delays provided by the components (116 and 118) and (136+138). By calculating the difference between the corresponding periods of the frequency X and frequency Y, such common terms can be canceled out and only the difference between the delay provided by the first delay circuit 112 ($D_{112}$) and the delay provided by the second delay circuit 132 ($D_{132}$) remains such that the noise window actually used by the jitter detector 108 can be accurately determined.

In an example, when the reference frequency 155 is provided as 200 MHz and the predefined constant is set at 32, the corresponding period of the lowered reference frequency is about 160 nanoseconds. After the oscillation loops 151 and 153 passing through the first delay circuit 112 and the oscillation loops 155 and 157 passing through the second delay circuit 132 are respectively formed, the first frequency counter 122 determines (counts) $N_1$ as 319±1 and the second frequency counter 142 determines (counts) $N_2$ as 316±1 such that the corresponding period of the frequency X can be calculated to range from 500 (i.e., 160/320) picoseconds to 503.1 (i.e., 160/318) picoseconds, and the corresponding period of the frequency Y can be calculated to range from 504.7 (i.e., 160/317) picoseconds to 507.9 (i.e., 160/315) picoseconds. As such, the actually used noise window can be determined to range from 1.6 (i.e., 504.7-503.1) picoseconds to 7.9 (i.e., 507.9-500) picoseconds.

In another example, when the reference frequency 155 is provided as 50 MHz and the predefined constant is set at 32, the corresponding period of the lowered reference frequency is about 640 nanoseconds. After the oscillation loops 151 and 153 passing through the first delay circuit 112 and the oscillation loops 155 and 157 passing through the second delay circuit 132 are respectively formed, the first frequency counter 122 determines (counts) $N_1$ as 1277±1 and the second frequency counter 142 determines (counts) $N_2$ as 1265±1 such that the corresponding period of the frequency X can be calculated to range from 500.8 (i.e., 640/1278) picoseconds to 501.6 (i.e., 640/1276) picoseconds, and the corresponding period of the frequency Y can be calculated to range from 505.5 (i.e., 640/1266) picoseconds to 506.3 (i.e., 640/1264) picoseconds. As such, the actually used noise window can be determined to range from 3.9 (i.e., 505.5-501.6) picoseconds to 5.5 (i.e., 506.3-500.8) picoseconds.

Figure 2A:
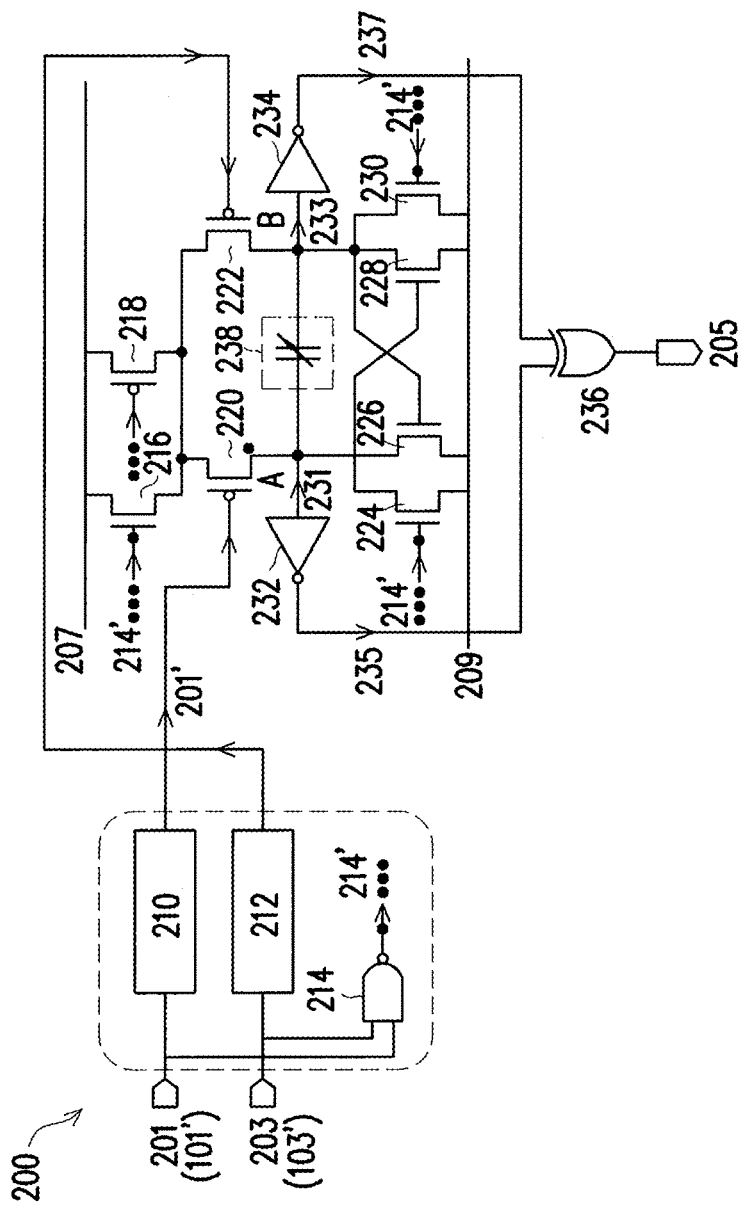
FIG. 2A illustrates an exemplary circuit diagram of the jitter detector of the jitter monitoring circuit shown in FIG. 1, in accordance with some embodiments.
Figure 2B:
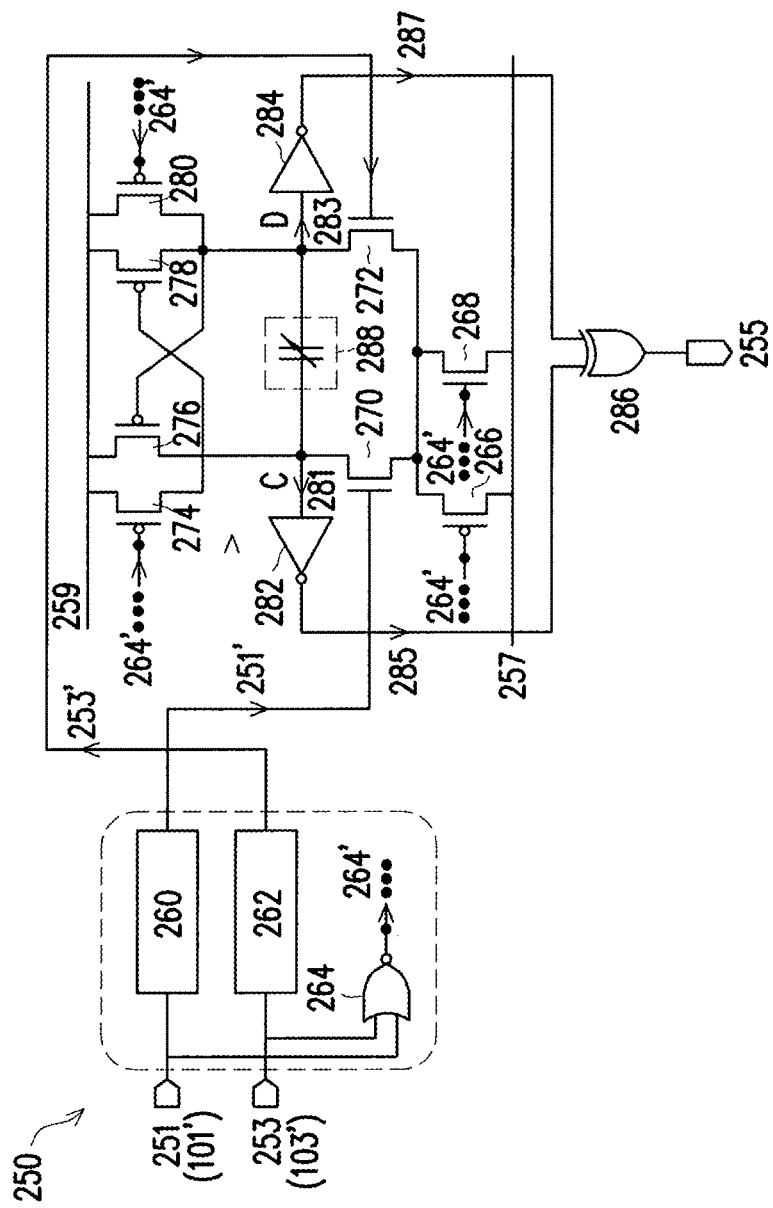
FIG. 2B illustrates another exemplary circuit diagram of the jitter detector of the jitter monitoring circuit shown in FIG. 1, in accordance with some embodiments.

FIGS. 2A and 2B respectively illustrate circuit diagrams of different embodiments of the jitter detector 108, in accordance with some embodiments. More specifically, the illustrated embodiment shown in FIG. 2A is a p-type jitter detector configured to compare respective "rising" edges of the clock signal 101 and the reference clock signal 103, and the illustrated embodiment shown in FIG. 2B is an n-type jitter detector configured to compare respective "falling" edges of the clock signal 101 and the reference clock signal 103. For purposes of clarity, the p-type jitter detector in FIG. 2A is herein referred to as "pJD 200," and the n-type jitter detector in FIG. 2B is herein referred to as "nJD 250."

Referring first to FIG. 2A, the pJD circuit 200 includes a first delay circuit 210, a second delay circuit 212, a logic gate 214, transistors 216, 218, 220, 222, 224, 226, 228, and 230, inverters 232 and 234, a logic gate 236, and a tuning circuit 238. In some embodiments, the first and second delay circuits 210 and 212 may each include a plurality of serially coupled buffers, inverters, or the like (not shown). The first delay circuit 210 is configured to receive a clock signal 201 and provide a delayed clock signal, e.g., 201', and the second delay circuit 212 is configured to receive a reference clock signal 203 and provide a delayed reference clock signal, e.g., 203'. In some embodiments, the clock signal 201 and reference clock signal 203 in the illustrated embodiment of FIG. 2A may correspond to the signals received at the inputs 108A and 108B of the jitter detector 108, respectively (FIG. 1). That is, the clock signal 201 and reference clock signal 203 may be the delayed clock signal 101' and delayed reference clock signal 103' that have been respectively delayed by the first delay circuit 112 and second delay circuit 132. In some embodiments, the logic gate 214 of the pJD circuit 200 may include a NAND logic gate that is configured to perform a NAND logic function on the clock signal 201 and the reference clock signal 203 so as to provide a control signal 214' based on a NAND'ed result of logic states of the clock signal 201 and the reference clock signal 203.

In some embodiments, the transistors 216, 224, 226, 228, and 230 may be each implemented by an n-type metal-oxide-semiconductor (NMOS) field-effect-transistor (FET), and the transistors 218, 220, and 222 may be each implemented by a p-type metal-oxide-semiconductor (PMOS) field-effect-transistor (FET). However, it is noted that the transistors 216 to 230 may each be implemented as any of various types of transistors (e.g., a bipolar junction transistor (BJT), a high-electron mobility transistor (HEMT), etc.) while remaining within the scope of the present disclosure.

More specifically, the transistors 216 and 218 are commonly coupled to a first supply voltage 207 (e.g., Vdd) at respective drain and source, and gated by the control signal 214'. The transistor 220 is coupled to the transistor 216's source by its respective source, and gated by the delayed clock signal 201'. Similarly, the transistor 222 is coupled to the transistor 218's drain by its respective source, and gated by the delayed reference clock signal 203'. And the transistor 218's drain is coupled to the transistor 216's source. The transistors 224 and 226 are coupled to a drain of the transistor 220 by their respective drains at a common node "A," and to a second supply voltage 209 (e.g., Vss or ground) by their respective sources. In some embodiments, the transistor 224 is gated by the control signal 214'. Similarly, the transistors 228 and 230 are coupled to a drain of the transistor 222 by their respective drains at a common node "B," and to the second supply voltage 209 (e.g., Vss or ground) by their respective sources. In some embodiments, the transistor 230 is gated by the control signal 214'.

More specifically, in some embodiments, the transistors 226 and 228 are cross-coupled to each other. That is, a gate of the transistor 226 is coupled to the drain of the transistor 228 and a gate of the transistor 228 is coupled to the drain of the transistor 226 so as to allow the transistors 226 and 228 to function as a latch circuit, which will be discussed in further detail below with respect to FIG. 3A.

In some embodiments, the inverters 232 and 234 are configured to receive signals present at nodes A and B (hereinafter "signal 231" and "signal 233"), respectively, as respective input signals, and provide respective logically inverted signals 235 and 237. The signals 235 and 237 are received by the logic gate 236, which may be implemented as an XOR logic gate in some embodiments. The logic gate 236 is configured to perform an XOR logic function on the signals 235 and 237 so as to provide the signal 205 whose logic state is determined based on an XOR'ed result of logic states of the signals 235 and 237. In some embodiments, the signal 205 may be the output of the jitter detector 108.

Figure 4:
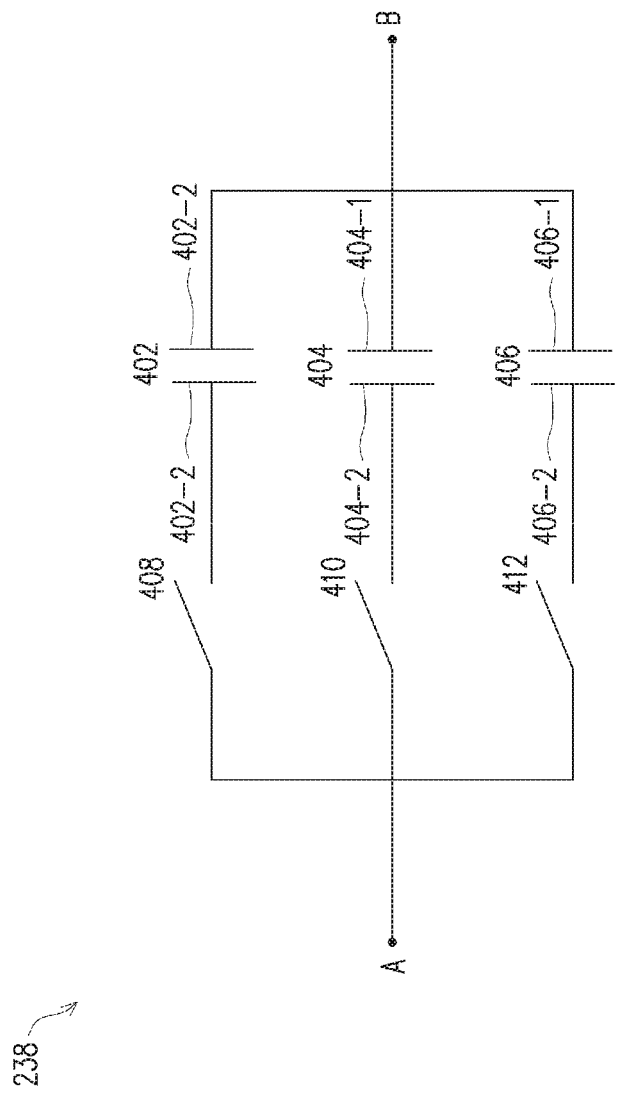
FIG. 4 illustrates an exemplary circuit diagram of the tuning circuit of the jitter detector shown in FIG. 2A or 2B, in accordance with some embodiments.

An exemplary circuit diagram of the tuning circuit 238 is illustrated in FIG. 4. In some embodiments, the tuning circuit 238 includes one or more capacitors 402, 404, and 406 coupled between the nodes A and B by respective switches 408, 410, and 412. More specifically, the capacitor 402 includes two conductive plates 402-1 and 402-2, wherein one conductive plate (e.g., 402-1) is coupled to the node B and the other conductive plate (e.g., 402-2) is coupled to the node A through the switch 410; the capacitor 404 includes two conductive plates 404-1 and 404-2, wherein one conductive plate (e.g., 404-1) is coupled to the node B and the other conductive plate (e.g., 404-2) is coupled to the node A through the switch 408; and the capacitor 406 includes two conductive plates 406-1 and 406-2, wherein one conductive plate (e.g., 406-1) is coupled to the node B and the other conductive plate (e.g., 406-2) is coupled to the node A through the switch 412.

According to some embodiments, each of the switches 408, 410 and 412 may be selectively turned on/off to tune a noise window, of the pJD circuit 200. More specifically, when more switches are turned on, more capacitors are electrically coupled between the nodes A and B, which causes the noise window to become wider. Conversely, when less switches are turned on, less capacitors are electrically coupled between the nodes A and B, which causes the noise window to become narrower. Although only three capacitors 402, 404 and 406 (and corresponding switches 408, 410 and 410) are shown in the illustrated embodiment of FIG. 4, it is understood that any desired number of capacitors (and corresponding switches) may be included in the tuning circuit 238.

As mentioned above, the noise window is used, by the jitter detector 108 (the pJD circuit 200 in the example of FIG. 2A), to determine whether the jitter contained in the clock signal 101 exceeds the noise window. In some embodiments, although the noise window of the tuning circuit 238 can be designed before manufacturing, due to a variety of process variations on the components of the tuning circuit 238, the noise window actually used by the jitter detector 108 may be deviated from the originally designed noise window. In this regard, the disclosed jitter monitoring circuit 100 can accurately determine the noise window actually used by the jitter detector 108, as discussed above.

Figure 3A:
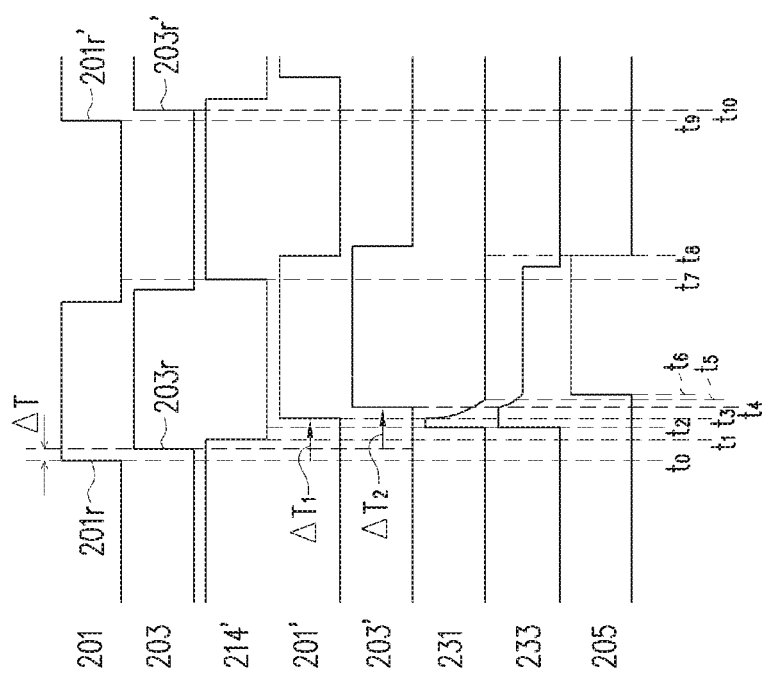
FIG. 3A illustrates exemplary waveforms of plural signals to operate the jitter detector of FIG. 2A, in accordance with some embodiments.

FIG. 3A illustrates exemplary waveforms of signals 201, 203, 214', 201', 203', 231, 233, and 205 to operate the pJD circuit 200 of FIG. 2A, in accordance with some embodiments. Each waveform of the signals 201, 203, 214', 201', 203', 231, 233, and 205 illustrated in FIG. 3A varies between logic 1 and logic 0 over time. It is noted that the clock signal 201 and reference clock signal 203 may respectively correspond to the delayed clock signal 101' and delayed reference clock signal 103'.

As mentioned above, jitter is a deviation from a true periodicity of a presumably periodic signal. In some embodiments, the reference clock signal 203 may be used as the "presumably periodic signal" that is used to examine the clock signal 201 and to determine whether a deviation of the clock signal 201 from the presumably periodic signal 203 exceeds a noise window. In some embodiments, when the clock signal 201 contains jitter (i.e., has a deviation) that exceeds the noise window (i.e., an intolerable amount of jitter) on its respective rising edge, the pJD circuit 200 may pull the signal 205 to logic 1, as mentioned above. FIG. 3A illustrates a scenario where the clock waveform signal 201 contains jitter that exceeds a predetermined threshold, which is detected by the pJD circuit 200, and the corresponding signals that are used or generated by the pJD circuit 200 (i.e., signals 214', 201', 203', 231, 233 and 205).

As shown in FIG. 3A, the clock signal 201's rising edge 201r deviates from the reference clock signal 203's rising edge 203r. More specifically, the rising edge 201r occurs "ΔT" ahead of the rising edge 203r. Alternative stated, the rising edges 201r and 203r have a timing difference ΔT from each other. As described above, the logic gate 214 performs the NAND logic function on the clock signal 201 and the reference clock signal 203. As known in the art, only when both the signals 201 and 203 transition to logic 1, the logic gate 214 can output the control signal 214' as logic 0.

Prior to time "t0," the control signal 214' is at logic 1, and at time t0, the control signal 214' remains at logic 1 because the logic states of the signals 201 and 203 are at logic 0. It is noted that the transistors 216, 218, 224, and 230 are all gated by the signal 214'. Accordingly, when the control signal 214' is at logic 1, the "NMOS" transistors 216, 224, and 230 are turned on, and the "PMOS" transistor 218 is turned off. In some embodiments, the transistor 216 may serve as a pre-charge circuit to pre-charge the transistors 220 and 222, and more specifically, the sources of the transistors 220 and 222, before the transistors 220 and 222 are turned off since, at time t0, the transistors 220 and 222 are turned on. The transistor 218 may serve as a current source after the control signal 214's is pulled to logic 0, and the transistors 224 and 230 are configured to perform a reset function after the control signal 214's is pulled back to logic 1, which will be discussed further below, respectively. Moreover, in some embodiments, a respective size of the transistor 216 may be selected to be substantially smaller than other transistors (e.g., the transistors 220, 222, 224, 226, 228, and 230) such that prior to time t0 (e.g., before signal 214' transitions to logic 0) a stand-by current (also known as a "DC current") may be minimized and respective logic states at nodes A and B may remain at logic 0. Thus, noise and/or false logic state(s), caused by the latch circuit formed by the transistors 226 and 228, can be advantageously avoided.

Subsequently, at time "t1," since both the clock signal 201 and the reference clock signal 203 have transitioned to logic 1, respectively, the (NAND) logic gate 214 transitions the control signal 214' to logic 0, which turns off the transistor 216 and turn on the transistor 218 such that the transistor 216 may stop pre-charging the transistors 220 and 220 and the transistor 218 may start charging the voltage levels at nodes A and B through the ON transistors 220 and 222, respectively. It is noted that because of signal propagation delays caused by the logic gate 214, the control signal 214' may not transition to logic 0 immediately after both signals 201 and 203 transition to logic 1. As mentioned above, the first and second delay circuits 210 and 212 respectively delay the clock signal 201 and the reference clock signal 203. More specifically, in some embodiments, the first delay circuit 210 may delay the clock signal 201 by a delay "$\Delta T_1$" so as to provide the delayed signal 201' as shown; and the second delay circuit 212 may delay the clock signal 203 by a delay "$\Delta T_2$" so as to provide the delayed signal 203' as shown. In some embodiments, the delays $\Delta T_1$ and $\Delta T_2$ may be substantially similar to each other.

At time "t2," because of the delays, rising edges of the delayed signals 201' and 203' have not been received by the "PMOS" transistors 220 and 222, i.e., the delayed signals 201' and 203' are still at logic 0. Thus, the transistors 220 and 222 remain in the ON state. And the transistor 216 remains OFF and the transistor 218 remains ON because the control signal 214' has been pulled to logic 0 at time t1. The transistor 218, which serves as the current source as mentioned above, is configured to keep charging voltage levels at nodes A and B. As such, the voltage levels at nodes A and B (i.e., the signals 231 and 233) may be charged to logic 1 through the ON transistors 220 and 222.

At time "t3," the rising edge of the delayed signal 201' is received by the gate of the transistor 220 so that the transistor 220 is turned off. Accordingly, the voltage level at the node A (i.e., the signal 231) starts being discharged through the transistor 226 at time t3. Similarly, at time "t4," the rising edge of the delayed signal 203' is received by the gate of the transistor 222 so that the transistor 222 is turned off. Accordingly, the voltage level at the node B (i.e., the signal 233) starts being discharged through the transistor 228 at time t4. In some embodiments, because of the substantially similar delays $\Delta T_1$ and $\Delta T_2$, the timing difference "$\Delta T$" between the rising edges 201r and 203r is reflected to the delayed signals 201' and 203' accordingly to turn off the transistors 220 and 222 at different times. The signals 231 and 233 may start being discharged at different times, i.e., the times t3 and t4 are different and the time t4 is subsequent to the time t3. As such, the signal 231 may transition to logic 0 faster than the signal 233. Moreover, as mentioned above, the transistors 226 and 228 function as a latch circuit. That is, once either one of the signals 231 and 233 transitions to a detectable logic state (e.g., a low enough voltage level), the logic states of the signals 231 and 233 may be latched to their current respective states. In a non-limiting example, when either one of the signals 231 and 233 transitions to a low enough voltage level, the logic state of the signal that transitions to the low enough voltage level may be latched to logic 0, and the logic state of the other signal may be complementarily latched to logic 1 (i.e., stops being discharged).

In the example of FIG. 3A, since the signal 231 transitions to logic 0 (i.e., a low enough voltage level) at about time "t5" while the signal 233 is still being discharged, the logic states of the signals 231 and 233 may be latched to logic 0 and logic 1, respectively. That is, the signal 231 is latched to logic 0 and the signal 233 stops being discharged and latched to logic 1. In an example, in a scenario where the signals 231 and 233 start discharging at the same time (i.e., t3=t4) or at two substantially close times (i.e., t4 is substantially close to t3), the logic states of the signals 231 and 233 become non-differentiable (i.e., both logic states of the signals 231 and 233 are at either logic 1 or logic 0), which causes the latch circuit formed by the transistors 226 and 228 to fail to latch a logic state within such a narrow timing difference between times t3 and t4. Alternatively stated, when the timing difference between times t3 and t4 becomes smaller than the noise window, the latch circuit formed by the transistors 226 and 228 cannot latch signal 231 and signal 233 into inversed logic states (either logic 1 or logic 0).

On the other hand, as shown in FIG. 3A, when the timing difference between times t3 and t4 exceeds the noise window, the logic states of the signals 231 and 233 are differentiable because the logic state of the signal 231 transitions to logic 0 first. Accordingly, the latch circuit formed by the transistors 226 and 228 can latch the logic states of the signals 231 and 233 as logic 0 and logic 1, respectively. Subsequently, the signals 231 and 233 are logically inverted through the respective inverters 232 and 234 to become the signals 235 (now transitioning to logic 1) and 237 (now transitioning to logic 0).

At time "t6," the logic gate 236 performs the XOR logic function on the logically inverted signals 235 and 237. As known in the art, an XOR logic gate outputs a logic 1 when inputs of the XOR logic gate are in different logic states. Accordingly, the (XOR) logic gate 236 transitions the signal 205 to logic 1 at time t6. As mentioned above, when the signal 205 is pulled to logic 1, the pJD circuit 200 may thus determine that the deviation $\Delta T$ of the rising edge 201r (of the clock signal 201) from the rising edge 203' (of the reference clock signal 203) exceeds the noise window, in accordance with some embodiments.

Subsequently, at time "t7," since at least one of the clock signal 201 and the reference clock signal 203 transitioned to logic 0, the control signal 214' (NAND'ing at least one LOW from either the signal 201 or signal 203) transitions to logic 1. Accordingly, the transistors 224 and 230 are turned on. As mentioned above, the transistors 224 and 230, in some embodiments, may form a reset circuit. That is, when the transistors 224 and 230 are turned on, such a reset circuit is enabled, which starts to discharge the signals 231 and 233. In some embodiments, the signal 233 may be pulled back to logic 0 slightly after time t7.

At time "t8," the signals 235 and 237 both transition to logic 1 by logically inverting the signals 231 and 233 through the inverters 232 and 234, respectively, so that the signal 205 is reset to logic 0 (XOR'ing two logic 1's of the signals 235 and 237). It is noted that because of some signal propagation delays caused by the inverters 232 and 234, respectively, the signal 205 may not transition to logic 0 immediately after the signals 231 and 233 are pulled back to logic 0. In some embodiments, after the signal 205 is reset to logic 0, following the operations described above, the pJD circuit 200 may be configured to be ready to monitor whether a subsequent rising edge (e.g., 201r') of the clock signal 201 contains an intolerable amount of jitter when comparing to a rising edge (e.g., 203r') of the reference clock signal 203. The rising edge 201r' may be received by the first delay circuit 210 at a subsequent time (e.g., time "t9"), and the rising edge 203r' may be received by the second delay circuit 212 at another subsequent time (e.g., time "t10").

Referring now to FIG. 2B, similar to the pJD circuit 200, in some embodiments, the nJD circuit 250 includes a first delay circuit 260, a second delay circuit 262, a logic gate 264, transistors 266, 268, 270, 272, 274, 276, 278, and 280, inverters 282 and 284, a logic gate 286, and a tuning circuit 288. The tuning circuit 288 is substantially similar to the tuning circuit 238, which is described above with respect to FIG. 2A. Also, the first and second delay circuits 260 and 262 may each include a plurality of serially coupled buffers, inverter, or the like (not shown). The first delay circuit 260 is configured to receive a clock signal 251 and provide a delayed clock signal, e.g., 251', and the second delay circuit 262 is configured to receive the reference clock signal 253 and provide a delayed reference clock signal, e.g., 253'. In some embodiments, the clock signal 251 and reference clock signal 253 in the illustrated embodiment of FIG. 2B may correspond to the signals received at inputs 108A and 108B of the jitter detector 108, respectively (FIG. 1). That is, the clock signal 251 and reference clock signal 253 may be the delayed clock signal 101' and delayed reference clock signal 103', respectively, that have been respectively delayed by the first delay circuit 112 and second delay circuit 132.

Different from the pJD circuit 200, in some embodiments, the logic gate 264 of the nJD circuit 250 may include a NOR logic gate that is configured to perform a NOR logic function on the clock signal 251 and the reference clock signal 253 so as to provide a control signal 264' based on a NOR'ed result of logic states of the clock signal 251 and the reference clock signal 253. Further, the transistors 268, 270, and 272 may be each implemented by an NMOS FET, and the transistors 266, 274, 276, 278, and 280 may be each implemented by a PMOS FET. However, it is noted that the transistors 266 to 280 may be each implemented by any of various types of transistors (e.g., a bipolar junction transistor (BJT), a high-electron mobility transistor (HEMT), etc.) while remaining within the scope of the present disclosure.

In some embodiments, the transistors 266 and 268 are commonly coupled to a first supply voltage 257 (e.g., Vss or ground) at a respective drain and source, and gated by the control signal 264'. The transistor 270 is coupled to the transistor 266's source by its respective source, and gated by the delayed clock signal 251'. The transistor 272 is coupled to the transistor 268's drain by its respective source, and gated by the delayed reference clock signal 253'. And the transistor 268's source is coupled to the transistor 266's drain. The transistors 274 and 276 are coupled to a drain of the transistor 270 by their respective drains at a common node "C," and to a second supply voltage 259 (e.g., Vdd) by their respective sources. In some embodiments, the transistor 274 is gated by the control signal 264'. Similarly, the transistors 278 and 280 are coupled to a drain of the transistor 272 by their respective drains at a common node "D," and to the second supply voltage 259 (e.g., Vdd) by their respective sources. In some embodiments, the transistor 280 is gated by the control signal 264'.

More specifically, in some embodiments, the transistors 276 and 278 are cross-coupled to each other. That is, a gate of the transistor 276 is coupled to the drain of the transistor 728 and a gate of the transistor 278 is coupled to the drain of the transistor 276 so as to allow the transistors 276 and 278 to function as a latch circuit that is substantially similar to the latch circuit formed by the transistors 226 and 228 of the pJD circuit 200.

In some embodiments, the inverters 282 and 284 are configured to receive signals present at nodes C and D (hereinafter "signal 281" and "signal 283"), respectively, as respective input signals, and provide respective logically inverted signals 285 and 287. The signals 285 and 287 are received by the logic gate 286, which may be similarly implemented as an XOR logic gate in some embodiments. The logic gate 286 is configured to perform the XOR logic function on the signals 285 and 287 so as to provide the signal 255 whose logic state is determined based on an XOR'ed result of logic states of the signals 285 and 287. In some embodiments, the signal 255 may be the output of the jitter detector 108.

Figure 3B:
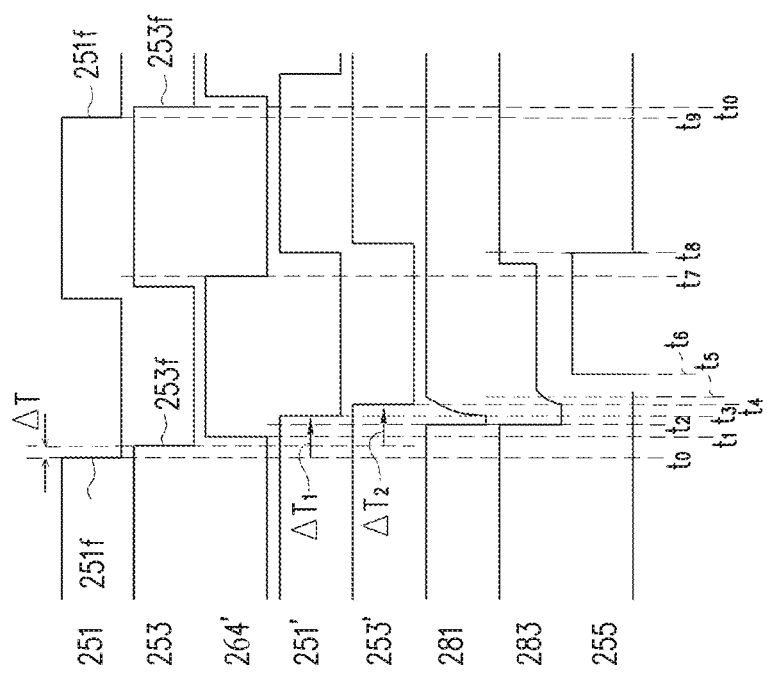
FIG. 3B illustrates exemplary waveforms of plural signals to operate the jitter detector of FIG. 2B, in accordance with some embodiments.

FIG. 3B illustrates exemplary waveforms of signals 251, 253, 264', 251', 253', 281, 283, and 255 to operate the nJD circuit 250 of FIG. 2B, in accordance with some embodiments. Each waveform of the signals 251, 253, 264', 251', 253', 281, 283, and 255 illustrated in FIG. 3B varies between logic 1 and logic 0 over time. It is noted that the clock signal 251 and reference clock signal 253 may respectively correspond to the delayed clock signal 101' and delayed reference clock signal 103'.

Similar to the operation of the pJD circuit 200, in some embodiments, the reference clock signal 253 may be used as the "presumably periodic signal," and the clock signal 251 may be used as a to-be examined signal to determine whether a deviation of the clock signal 251 from the presumably periodic signal 253 exceeds a noise window. When the clock signal 251 contains jitter (i.e., the deviation) that exceeds the noise window (i.e., an intolerable amount of jitter) on its respective falling edge, the nJD circuit 250 may pull the signal 255 to logic 1. Accordingly, in order to explain how the "intolerable" jitter on the falling edge of the clock signal 251 is detected by the nJD circuit 250, in FIG. 3B, the waveform of signal 251 (received by the nJD circuit 250) illustrates such a scenario and how the nJD circuit 250 responds by using signals 264', 251', 253', 281, and 283 to pull the signal 255 to logic 1.

As shown in FIG. 3B, the clock signal 251's falling edge 251f is deviated from the reference clock signal 253's falling edge 253f. More specifically, the falling edge 251f occurs "ΔT" ahead of the falling edge 253f. Alternative stated, the rising edges 251f and 253f have a timing difference ΔT from each other. As described above, the logic gate 264 performs the NOR logic function on the clock signal 251 and the reference clock signal 253. As known in the art, only when both the signals 251 and 253 transition to logic 0, the logic gate 264 can output the control signal 264' as logic 1.

Prior to time "t0," the control signal 264' is at logic 0, and at time t0, the control signal 264' remains at logic 0, because the logic states of the signals 251 and 253 are at logic 1. It is noted that the transistors 266, 268, 274, and 280 are all gated by the signal 264'. Accordingly, when the control signal 264' is at logic 0, the "NMOS" transistor 268 is turned off, and the "PMOS" transistors 266, 274, and 280 are turned on. In some embodiments, the transistor 266 may serve as a pre-discharge circuit to pre-discharge the transistors 270 and 272, and more specifically, the sources of the transistors 270 and 272, before the transistors 270 and 272 are turned off, since, at time t0, the transistors 270 and 272 are turned on. The transistor 268 may serve as a current sink after the control signal 264's is pulled to logic 1, and the transistors 274 and 280 are configured to perform a reset function after the control signal 264's is pulled back to logic 0, which will be discussed below, respectively. Moreover, in some embodiments, a respective size of the transistor 266 may be selected to be substantially smaller than other transistors (e.g., the transistors 270, 272, 274, 276, 278, and 280) such that prior to time t0 (e.g., before signal 264' transitions to logic 1) a stand-by current (also known as a "DC current") may be minimized and respective logic states at nodes C and D may remain at logic 1. Thus, noise and/or false logic state(s), caused by the latch circuit formed by the transistors 276 and 278, can be advantageously avoided.

Subsequently, at time "t1," since both the clock signal 251 and the reference clock signal 253 have transitioned to logic 0, respectively, the (NOR) logic gate 264 transitions the control signal 264' to logic 1, which turns off the transistor 266 and turn on the transistor 268 such that the transistor 266 may stop pre-discharging the transistors 270 and 272 and the transistor 268 may start discharging the voltage levels at nodes C and D through the ON transistors 270 and 272, respectively. It is noted that because of a signal propagation delay caused by the logic gate 264, the control signal 264' may not transition to logic 1 immediately after both signals 251 and 253 transition to logic 0. As mentioned above, the first and second delay circuits 260 and 262 respectively delay the clock signal 251 and the reference clock signal 253. More specifically, in some embodiments, the first delay circuit 260 may delay the clock signal 251 by a delay "$\Delta T_1$" so as to provide the delayed signal 251' as shown; and the second delay circuit 262 may delay the clock signal 253 by a delay "$\Delta T_2$" so as to provide the delayed signal 253' as shown. In some embodiments, the delays $\Delta T_1$ and $\Delta T_2$ may be substantially similar to each other.

At time "t2," because of the delays, falling edges of the delayed signals 251' and 253' have not been received by the "NMOS" transistors 270 and 272, i.e., the delayed signals 251' and 253' are still at HIGH. Thus, the transistors 270 and 272 are remained ON. And the transistor 266 is remained OFF and the transistor 268 is remained ON because the control signal 264' has been pulled to HIGH at time t1. The transistor 268, served as the current sink as mentioned above, is configured to keep discharging voltage levels at nodes C and D. As such, the voltage levels at nodes A and B (i.e., the signals 281 and 283) may be discharged to LOW through the ON transistors 520 and 522.

At time "t3," the falling edge of the delayed signal 251' is received by the gate of the transistor 270 so that the transistor 270 is turned off. Accordingly, the voltage level at the node C (i.e., the signal 281) starts being charged through the transistor 276 at time t3. Similarly, at time "t4," the falling edge of the delayed signal 253' is received by the gate of the transistor 272 so that the transistor 272 is turned off. Accordingly, the voltage level at the node D (i.e., the signal 283) starts being charged through the transistor 278 at time t4.

In some embodiments, because of the substantially similar delays $\Delta T_1$ and $\Delta T_2$, the timing difference "$\Delta T$" between the falling edges 251f and 253f is reflected to the delayed signals 251' and 253' accordingly to turn off the transistors 270 and 272 at different times. The signals 281 and 283 may start being charged at different times, i.e., the times t3 and t4 are different and the time t4 is subsequent to the time t3. As such, the signal 281 may transition to logic 1 faster than the signal 283. Moreover, as mentioned above, the transistors 276 and 278 function as a latch circuit. That is, once either one of the signals 281 and 283 transitions to a detectable logic state (e.g., a high enough voltage level), the logic states of the signals 281 and 283 may be latched as what they currently are. In a non-limiting example, when either one of the signals 281 and 283 transitions to a high enough voltage level, the logic state of the signal that transitions to the high enough voltage level may be latched to logic 1, and the logic state of the other signal may be complementarily latched to logic 0 (i.e., stops being charged).

In the example of FIG. 3B, since the signal 281 transitions to logic 1 (i.e., a high enough voltage level) at about time "t5" while the signal 283 is still being charged, the logic states of the signals 281 and 283 may be latched to logic 1 and logic 0, respectively. That is, the signal 281 is latched to logic 1 and the signal 583 is stopped being charged and latched to logic 0.

In an example, when the signals 281 and 283 start being charged at the same time (i.e., t3=t4) or at two substantially close times (i.e., t4 is substantially close to t3), the logic states of the signals 281 and 283 become non-differentiable (i.e., both logic states of the signals 281 and 283 are at either logic 1 or logic 0), which causes the latch circuit formed by the transistors 276 and 278 to fail to latch a logic state within such a narrow timing difference between times t3 and t4. Alternatively stated, when the timing difference between times t3 and t4 becomes smaller than the noise window, the latch circuit formed by the transistors 276 and 278 cannot latch signal 281 and signal 283 into inversed logic states (either logic 1 or logic 0).

On the other hand, which is the case shown in FIG. 3B, when the timing difference between times t3 and t4 exceeds the noise window, the logic states of the signals 281 and 283 are differentiable because the logic state of the signal 281 transitions to logic 1 first. Accordingly, the latch circuit formed by the transistors 276 and 278 can latch the logic states of the signals 281 and 283 as logic 1 and logic 0, respectively. Subsequently, the signals 281 and 283 are logically inverted through the respective inverters 282 and 284 to become the signals 285 (now transitioning to logic 0) and 287 (now transitioning to logic 1).

At time "t6," the logic gate 286 performs the XOR logic function on the logically inverted signals 285 and 287. As described above, an XOR logic gate outputs a logic 1 when inputs of the XOR logic gate are in different logic states. Accordingly, the (XOR) logic gate 286 transitions the signal 255 to logic 1 at time t6. When the signal 255 is pulled to logic 1, the nJD circuit 250 may thus determine that the deviation $\Delta T$ of the falling edge 251f (of the clock signal 251) from the falling edge 253*f* (of the reference clock signal 253*f*) exceeds the noise window, in accordance with some embodiments.

Subsequently, at time "t7," since at least one of the clock signal 251 and the reference clock signal 253 transitioned to logic 1, the control signal 264' (NOR'ing at least one logic 1 from either the signals 251 or signal 253) transitions to logic 0. Accordingly, the transistors 274 and 280 are turned on. As mentioned above, the transistors 274 and 280, in some embodiments, may form a reset circuit. That is, when the transistors 274 and 280 are turned on, such a rest circuit is enabled, which starts to charge the signals 281 and 283. In some embodiments, the signal 283 may be pulled back to logic 1 slightly after time t7.

At time "t8," the signals 285 and 287 both transition to logic 0 by logically inverting the signals 281 and 283 through the inverters 282 and 284, respectively, so that the signal 255 is reset to logic 0 (XOR'ing two LOW's of the signals 285 and 287). It is noted that because of some signal propagation delays caused by the inverters 282 and 284, respectively, the signal 255 may not transition to logic 0 immediately after the signals 281 and 283 are pulled back to logic 1. In some embodiments, after the signal 255 is reset to logic 0, following the operations described above, the nJD circuit 250 may be configured to be ready to monitor whether a subsequent falling edge (e.g., 251*f*) of the clock signal 251 contains an intolerable amount of jitter when comparing to a falling edge (e.g., 253*f*) of the reference clock signal 253. The falling edge 251*f* may be received by the first delay circuit 260 at a subsequent time (e.g., time "t9"), and the falling edge 253*f* may be received by the second delay circuit 262 at another subsequent time (e.g., time "t10").

Referring again to FIG. 1, in addition to the above-discussed Normal Monitoring Mode and Noise Window Calculation Mode, the jitter monitoring circuit 100 may be operated in a Built-In-Self-Test (BIST) Mode, in accordance with some embodiments. Further, the BIST Mode may be further divided to two sub-modes, a first sub-mode of the BIST Mode (hereinafter "BIST Mode 1") and a second sub-mode of the BIST Mode (hereinafter "BIST Mode 2"), which will be respectively discussed as follows.

When operating in the BIST Mode 1, the main control circuit 146 may activate one and deactivate the other of the first and second controllable buffers 110 and 130, such that one of the clock signals 101 and 103 can be received by the jitter detector 108 at one of its inputs (108A or 108B) through the corresponding delay circuit (112 or 132) and the other input of the jitter detector 108 may receive a signal with either the frequency X or Y. As mentioned above, the frequency X, present at the node X, and the frequency Y, present at the node Y, respectively correspond to the alternately formed oscillation loops (151 and 153) and (155 and 157), which typically contain a large amount of noise (e.g., jitter). Thus, when the jitter detector 108 compares these two signals (one of the delayed clock signals 101' and 103', and one of the signals with the frequency X or Y), the main control circuit 146 may expect the outputs provided by the jitter detector 108 are all logic 1's or mostly logic 1's (e.g., above a predefined percentage). However, if not (i.e., the logic 1's output by jitter detector 108 are less than the predefined percentage), the main control circuit 146 may determine that at least one of the components of the jitter monitoring circuit 100 is malfunctioning such as, for example, the first delay circuit 112, the second delay circuit 132, etc.

When operating in the BIST Mode 2, the main control circuit 146 may short the inputs 108A and 108B of the jitter detector 108. As such, the jitter detector 108 may receive only one delayed clock signal, for example, either 101' or 103'. Since the jitter detector 108 is now comparing a same (delayed) clock signal, the main control circuit 146 may expect the outputs provided by the jitter detector 108 are all logic 0's. However, if not, the main control circuit 146 may determine that the jitter detector 108 is malfunctioning.

Figure 5:
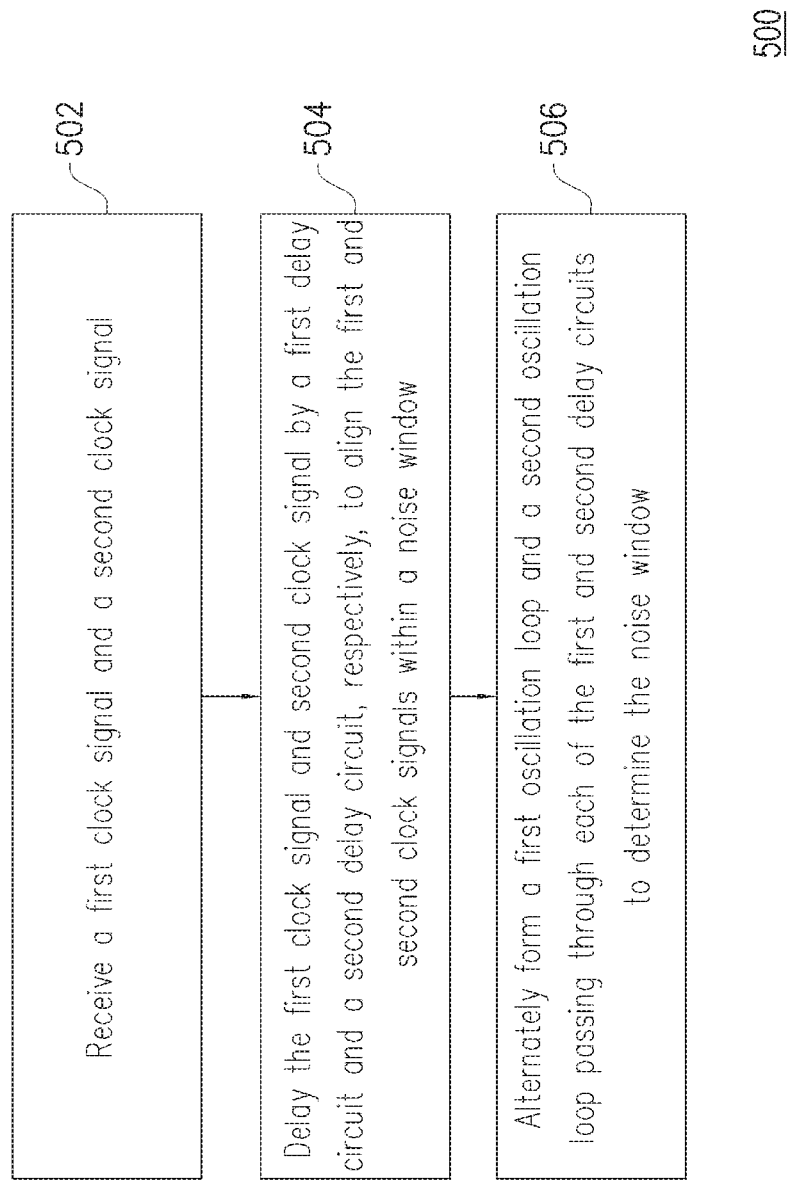
FIG. 5 illustrates a flow chart of an exemplary method to operate the jitter monitoring circuit of FIG. 1, in accordance with some embodiments.

FIG. 5 illustrates a flow chart of an exemplary method 500 to operate the jitter monitoring circuit 100 of FIG. 1, in accordance with some embodiments. In various embodiments, the operations of the method 500 are performed by the respective components illustrated in FIGS. 1-4. For purposes of discussion, the following embodiment of the method 500 will be described in conjunction with FIGS. 1-4. The illustrated embodiment of the method 500 is merely an example. Therefore, it should be understood that any of a variety of operations may be omitted, re-sequenced, and/or added while remaining within the scope of the present disclosure.

The method 500 starts with operation 502 in which a first clock signal and a second clock signal are received, in accordance with various embodiments. In the above example, the first and second clock signals may be received by the jitter monitoring circuit 100 as the to-be examined clock signal 101 and the reference clock signal 103.

The method 500 proceeds to operation 504 in which the first clock signal and second clock signal are respectively delayed by a first delay circuit and a second delay circuit to align the first and second clock signals within a noise window, in accordance with various embodiments. Continuing with the above example, the first delay circuit 112 may use a first delay code to delay the clock signal 101 and the second delay circuit 132 may use a second delay code to delay the reference clock signal 103 in order to cause the jitter detector 108 to output plural logic 0's over time, i.e., the first and second clock signals 101 and 103 are aligned within a noise window used by the jitter detector 108.

In some embodiments, the first and second delay codes used by the first and second delay circuits 112 and 132, respectively, are provided by the delay control circuit 106 fixing one of the first and second delay codes at a first value and sweeping available values to be the other of the first and second delay codes. As such, during operation 502, a delay code window may be determined by the delay control circuit 106. Such a delay code window, which is defined by a range of the swept values that can still cause the jitter detector 108 to output logic 0, may be used to determine the noise window used by the jitter detector 108, according to some embodiments of the present disclosure.

The method 500 proceeds to operation 506 in which a first oscillation loop and a second oscillation loop are alternately formed to pass through each of the first and second delay circuits so as to determine the noise window, in accordance with various embodiments. Using the same example, the delay control circuit 106 may still fix one of the first and second delay codes at the first value, but use one delay code greater than an upper boundary of the delay code window or one delay code less than a lower boundary of the delay code window as the other of the first and second delay codes. Subsequently, two oscillation loops are alternatively formed by the loop control circuit 104 to pass through each of the first and second delay circuits 112 and 132, which allows the first and second frequency counters 122 and 142 to calculate the frequencies X and Y so as to calculate the noise window used by the jitter detector 108, as discussed above.

In an embodiment, a circuit includes: a first delay circuit configured to receive a first clock signal; a second delay circuit configured to receive a second clock signal; a delay control circuit, coupled to the first and second delay circuits, and configured to cause the first and second delay circuits to respectively align the first and second clock signals within a noise window; and a loop control circuit, coupled to the first and second delay circuits, and configured to alternately form a first oscillation loop and a second oscillation loop passing through each of the first and second delay circuits so as to determine the noise window.

In another embodiment, a circuit includes: a first delay circuit configured to receive a first clock signal; a second delay circuit configured to receive a second clock signal; a delay control circuit, coupled to the first and second delay circuits, and configured to cause the first and second delay circuits to align the first and second clock signals within a noise window; a loop control circuit, coupled to the first and second delay circuits, and configured to alternately form a first oscillation loop and a second oscillation loop passing through each of the first and second delay circuits; a first frequency counter, coupled to the first delay circuit, and configured to count a number of cycles of the first and second oscillation loops passing through the first delay circuit using a reference frequency; and a second frequency counter, coupled to the second delay circuit, and configured to a number of cycles of the first and second oscillation loops passing through the second delay circuit using the reference frequency, wherein the noise window is determined based on the reference frequency and a difference between the number of cycles of the first and second oscillation loops passing through the first delay circuit and the number of cycles of the first and second oscillation loops passing through the second delay circuit.

In yet another embodiment, a method includes: receiving a first clock signal and a second clock signal; delaying the first and second clock signals by a first delay circuit and a second delay circuit, respectively, to align the first and second clock signals within a noise window; and alternately forming a first oscillation loop and a second oscillation loop passing through each of the first and second delay circuits to determine the noise window.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
a first delay circuit configured to receive a first clock signal;
a second delay circuit configured to receive a second clock signal;
a delay control circuit, coupled to the first and second delay circuits, and configured to cause the first and second delay circuits to respectively align the first and second clock signals within a noise window;
first and second oscillation loops passing through the first delay circuit; and
third and fourth oscillation loops passing through the second delay circuit, wherein the noise window is determined based on a number of cycles of the first and second oscillation loops passing through the first delay circuit and a number of cycles of the third and fourth oscillation loops passing through the second delay circuit.

2. The circuit of claim 1, wherein the first oscillation loop passing through the first delay circuit is formed by the first delay circuit and a first plurality of delay elements, and the second oscillation loop passing through the first delay circuit is formed by the first delay circuit and a second plurality of delay elements, and wherein the third oscillation loop passing through the second delay circuit is formed by the second delay circuit and the second plurality of delay elements, and the fourth oscillation loop passing through the second delay circuit is formed by the second delay circuit and the first plurality of delay elements.

3. The circuit of claim 2, further comprising:
a first frequency counter, coupled to the first delay circuit and the first and second pluralities of delay elements, and configured to count a number of cycles of the first and second oscillation loops passing through the first delay circuit using a reference frequency; and
a second frequency counter, coupled to the second delay circuit and the first and second pluralities of delay elements, and configured to count a number of cycles of the third and fourth oscillation loops passing through the second delay circuit using the reference frequency.

4. The circuit of claim 3, wherein the noise window is determined based on the reference frequency and a difference between the number of cycles of the first and second oscillation loops passing through the first delay circuit and the number of cycles of the third and fourth oscillation loops passing through the second delay circuit.

5. The circuit of claim 2, further comprising:
a first switch and a first multiplexer respectively coupled to the first delay circuit and the first and second pluralities of delay elements; and
a second switch and a second multiplexer respectively coupled to the second delay circuit and the first and second pluralities of delay elements.

6. The circuit of claim 5, further comprising a loop control circuit, wherein the loop control circuit is configured to control the first switch and first multiplexer to alternately form the first and second oscillation loops passing through the first delay circuit, and the second switch and second multiplexer to alternately form the third and fourth oscillation loops passing through the second delay circuit.

7. The circuit of claim 1, further comprising:
a jitter detector, coupled to the delay control circuit, and configured to receive the first and second clock signals through the first and second delay circuits, respectively, and detect whether a timing difference between the first and second clock signals exceeds the noise window.

8. The circuit of claim 7, wherein the delay control circuit is configured to respectively cause the first and second delay circuits to align the second clock signal with the first clock signal within a noise window in response to detecting that the timing difference between the first and second clock signals exceeds the noise window.

9. A circuit, comprising:
a first delay circuit configured to receive a first clock signal;
a second delay circuit configured to receive a second clock signal;

a delay control circuit, coupled to the first and second delay circuits, and configured to cause the first and second delay circuits to align the first and second clock signals within a noise window;

first and second oscillation loops passing through the first delay circuit;

third and fourth oscillation loops passing through the second delay circuit, wherein the first, second, third and fourth oscillation loops determine the noise window;

a first frequency counter, coupled to the first delay circuit, and configured to count a number of cycles of the first and second oscillation loops passing through the first delay circuit using a reference frequency; and a second frequency counter, coupled to the second delay circuit, and configured to count a number of cycles of the third and fourth oscillation loops passing through the second delay circuit using the reference frequency, wherein the noise window is determined based on the reference frequency and a difference between the number of cycles of the first and second oscillation loops passing through the first delay circuit and the number of cycles of the third and fourth oscillation loops passing through the second delay circuit.

10. The circuit of claim 9, wherein the first oscillation loop passing through the first delay circuit is formed by the first delay circuit and a first plurality of delay elements, and the second oscillation loop passing through the first delay circuit is formed by the first delay circuit and a second plurality of delay elements, and wherein the third oscillation loop passing through the second delay circuit is formed by the second delay circuit and the second plurality of delay elements, and the fourth oscillation loop passing through the second delay circuit is formed by the second delay circuit and the first plurality of delay elements.

11. The circuit of claim 9, wherein the first and second delay circuits each comprises a digitally controlled delay line.

12. The circuit of claim 10, further comprising:
a first switch and a first multiplexer respectively coupled to the first delay circuit and the first and second pluralities of delay elements; and
a second switch and a second multiplexer respectively coupled to the second delay circuit and the first and second pluralities of delay elements.

13. The circuit of claim 12, further comprising a loop control circuit, wherein the loop control circuit is configured to control the first switch and first multiplexer to alternately form the first and second oscillation loops passing through the first delay circuit, and the second switch and second multiplexer to alternately form the first and second oscillation loops passing through the second delay circuit.

14. The circuit of claim 13, wherein the first oscillation loop passing through the first delay circuit is formed by coupling the first switch to the first plurality of delay elements, the second oscillation loop passing through the first delay circuit is formed by coupling the first switch to the second plurality of delay elements, the third oscillation loop passing through the second delay circuit is formed by coupling the second switch to the second plurality of delay elements, and the fourth oscillation loop passing through the second delay circuit is formed by coupling the second switch to the first plurality of delay elements.

15. The circuit of claim 9, further comprising:
a jitter detector, coupled to the delay control circuit, and configured to receive the first and second clock signals through the first and second delay circuits, respectively, and detect whether a timing difference between the first and second clock signals exceeds the noise window.

16. The circuit of claim 15, wherein the delay control circuit is configured to cause the first and second delay circuits to respectively delay the first and second clock signals so as to align the first and second clock signals within the noise window in response to detecting that the timing difference between the first and second clock signals exceeds the noise window.

17. A method, comprising:
receiving a first clock signal and a second clock signal;
delaying the first and second clock signals by a first delay circuit and a second delay circuit, respectively, to align the first and second clock signals within a noise window;
forming first and second oscillation loops passing through the first delay circuit; and
forming third and fourth oscillation loops passing through the second delay circuit, wherein the noise window is determined based on a number of cycles of the first and second oscillation loops passing through the first delay circuit and a number of cycles of the third and fourth oscillation loops passing through the second delay circuit.

18. The method of claim 17, wherein the first oscillation loop passing through the first delay circuit is formed by the first delay circuit and a first plurality of delay elements, and the second oscillation loop passing through the first delay circuit is formed by the first delay circuit and a second plurality of delay elements, and wherein the third oscillation loop passing through the second delay circuit is formed by the second delay circuit and the second plurality of delay elements, and the fourth oscillation loop passing through the second delay circuit is formed by the second delay circuit and the first plurality of delay elements.

19. The method of claim 17, further comprising:
determining a number of cycles of the first and second oscillation loops passing through the first delay circuit using a reference frequency; and
determining a number of cycles of the third and fourth oscillation loops passing through the second delay circuit using the reference frequency.

20. The method of claim 19, further comprising:
determining the noise window based on the reference frequency, and a difference between the number of cycles of the first and second oscillation loops passing through the first delay circuit and the number of cycles of the third and fourth oscillation loops passing through the second delay circuit.

* * * * *